US012640644B2

(12) United States Patent
Aro et al.

(10) Patent No.: US 12,640,644 B2
(45) Date of Patent: May 26, 2026

(54) ELECTROMAGNETIC COMPATIBILITY FILTER ARRANGEMENT, ELECTRIC CONVERTER SYSTEM, AND METHOD OF MANUFACTURE OF ELECTROMAGNETIC COMPATIBILITY FILTER ARRANGEMENT FOR CONNECTING TO OUTPUT TERMINALS OF ELECTRIC CONVERTER

(71) Applicant: Vacon Oy, Vaasa (FI)

(72) Inventors: Lasse Aro, Vaasa (FI); Juho Kari, Vaasa (FI)

(73) Assignee: VACON OY, Vaasa (FI)

( * ) Notice: Subject to any disclaimer, the term of this patent is extended or adjusted under 35 U.S.C. 154(b) by 414 days.

(21) Appl. No.: 18/487,523

(22) Filed: Oct. 16, 2023

(65) Prior Publication Data

US 2024/0128861 A1     Apr. 18, 2024

(30) Foreign Application Priority Data

Oct. 18, 2022     (DE) .......................... 102022127355.5

(51) Int. Cl.
 *H02M 1/44* (2007.01)
 *H03H 1/00* (2006.01)
 *H03H 7/01* (2006.01)
(52) U.S. Cl.
 CPC ............ *H02M 1/44* (2013.01); *H03H 1/0007* (2013.01); *H03H 7/0115* (2013.01)
(58) Field of Classification Search
 CPC ........ H02M 1/44; H02M 1/126; H02M 1/123;

H02M 1/14; H02M 1/12; H02M 1/15; H02M 1/00; H02M 1/0058; H02M 1/0064; H02M 1/08; H02M 1/327; H02M 1/42;
(Continued)

(56) References Cited

U.S. PATENT DOCUMENTS

2018/0138849 A1     5/2018  Royak et al.
2021/0152077 A1*    5/2021  Strandberg .............. H02M 1/44

FOREIGN PATENT DOCUMENTS

CN          210123936 U   *  3/2020
DE          102016007421 A1   12/2017

* cited by examiner

*Primary Examiner* — Bryan R Perez
(74) *Attorney, Agent, or Firm* — McCormick, Paulding & Huber PLLC

(57) ABSTRACT

An electromagnetic compatibility filter arrangement (100) for connecting to output terminals (202A-202C) of an electric converter (210), such as of a frequency converter or an inverter. The electromagnetic compatibility filter arrangement (100) includes a plurality of electromagnetic compatibility filter devices (101A-101C). Each one of the devices (101A-101C) has a circuit board (11), a first connection element (16) in the circuit board (11) for providing electrical connection to an output terminal (202A-202C) of the electric converter (210), a first connector (14) for connecting to another of the plurality of electromagnetic compatibility filter devices (101A-101C), and at least one capacitor (12) arranged in the circuit board (11) and being electrically connected between the first connection element (16) and the first connector (14). The arrangement (100) also includes an electrical connection arrangement (20) for connecting the first connectors (14) of said plurality of electromagnetic compatibility filter devices (101A-101C) to each other.

16 Claims, 4 Drawing Sheets

101A

101A

(58) Field of Classification Search
CPC .... H02M 7/003; H02M 7/797; H02M 7/5387;
H02M 7/219
See application file for complete search history.

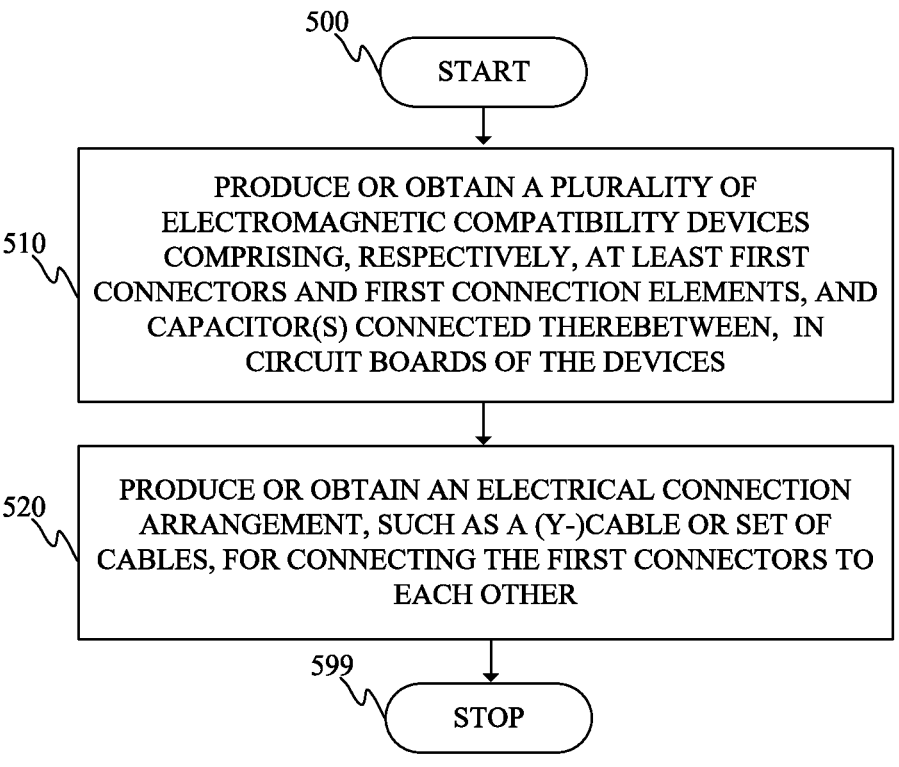

500 START

510 PRODUCE OR OBTAIN A PLURALITY OF ELECTROMAGNETIC COMPATIBILITY DEVICES COMPRISING, RESPECTIVELY, AT LEAST FIRST CONNECTORS AND FIRST CONNECTION ELEMENTS, AND CAPACITOR(S) CONNECTED THEREBETWEEN, IN CIRCUIT BOARDS OF THE DEVICES

520 PRODUCE OR OBTAIN AN ELECTRICAL CONNECTION ARRANGEMENT, SUCH AS A (Y-)CABLE OR SET OF CABLES, FOR CONNECTING THE FIRST CONNECTORS TO EACH OTHER

599 STOP

FIG. 5

ELECTROMAGNETIC COMPATIBILITY FILTER ARRANGEMENT, ELECTRIC CONVERTER SYSTEM, AND METHOD OF MANUFACTURE OF ELECTROMAGNETIC COMPATIBILITY FILTER ARRANGEMENT FOR CONNECTING TO OUTPUT TERMINALS OF ELECTRIC CONVERTER

CROSS-REFERENCE TO RELATED APPLICATION

This application claims foreign priority benefits under 35 U.S.C. § 119 from German Patent Application No. 102022127355.5, filed Oct. 18, 2022, the content of which is hereby incorporated by reference in its entirety.

TECHNICAL FIELD

The present invention relates in general to electromagnetic compatibility (EMC) filter arrangements used in electric power conversion applications. In particular, however, not exclusively, the present invention concerns an electromagnetic compatibility filter arrangement for connecting to output terminals of an electric converter, such as configured to operate an electric motor, an electric converter system comprising such an electromagnetic compatibility filter arrangement, and a method of manufacture of the filter arrangement.

BACKGROUND

Known EMC filters are manufactured as a single unit of, for example, with potted EMC capacitors, having wiring to output terminals of the electric converter and, therefore, end up far away from the terminals, such as tens of centimeters away, and perform sub-optimally or even poorly. The filter arrangement, especially in multi-phase applications, tend to become expensive and bulky, and requires careful consideration with respect to installation thereof in connection with the electric converter or the like. Furthermore, such filter arrangements, when connected to the output terminals, are difficult to disconnect since connections to filter capacitors for each of the output terminals must be disconnected separately.

SUMMARY

An objective of the present invention is to provide an electromagnetic compatibility filter arrangement for connecting to output terminals of an electric converter, an electric converter system, and a method of manufacture of an electromagnetic compatibility filter arrangement for connecting to output terminals of an electric converter. Another objective of the present invention is that the electromagnetic compatibility filter arrangement, the electric converter system, and the method provide a cost efficient and easy way to arrange an electromagnetic compatibility filter arrangement close to the output terminals of the converter, and makes it also easier to disconnect the filter arrangement when needed.

The objectives of the invention are reached by an electromagnetic compatibility filter arrangement for connecting to output terminals of an electric converter, an electric converter system, and a method of manufacture of an electromagnetic compatibility filter arrangement for connecting to output terminals of an electric converter as defined by the respective independent claims.

According to a first aspect, an electromagnetic compatibility filter arrangement for connecting to output terminals of an electric converter, such as of a frequency converter or an inverter, is pro-vided. The electromagnetic compatibility filter arrangement comprises a plurality of electromagnetic compatibility filter devices. Each one of the devices comprising a circuit board and a first connection element, such as a connector and/or a conductive patch or the like, in the circuit board for providing electrical connection, or to be connected, to an output terminal of the electric converter. Furthermore, each one of the devices comprises a first connector in the circuit board for connecting to another of the plurality of electromagnetic compatibility filter devices, and at least one capacitor in the circuit board and being electrically connected between the first connection element and the first connector. In addition, the electromagnetic compatibility filter arrangement comprises an electrical connection arrangement, such as a cable or a set of cables, for connecting the first connectors of said plurality of electromagnetic compatibility filter devices to each other.

In preferable embodiments, the electrical connection arrangement may comprise a plurality of third connectors adapted to be removably connected to respective ones of the first connectors.

Furthermore, the number of the third connectors may be at least three, and the third connectors may be connected in series with each other.

In some embodiments, the electrical connection arrangement has one common end or point of coupling (having one of the third connectors), and a plurality of other ends, such as in a Y-cable. The electrical connection arrangement may be adapted such that the other ends are electrically connected via the common end or point of coupling to each other only if the common end or point of coupling is also connected to the respective first connector (thus the other ends may be connected via the respective first connector). Therefore, detachment of the common end or point of coupling from the respective first connector causes simultaneously also electrical dis-connection of the other ends, even if they remain attached to their respective first connectors, because the electrical connection between the other ends is being interrupted by the detachment of the common end or point of coupling from the first connector.

Alternatively or in addition, at least one of the devices may comprise a second connector being electrical separated at least from the first connection element, the first connector, and the at least one capacitor of the at least one electromagnetic compatibility filter device for providing a fixed position for a third connector of the electrical connection arrangement, when the third connector is not connected to or is separated/disconnected from the first connector.

In various embodiments, the electromagnetic compatibility filter arrangement may be an LC filter arrangement and, thus, comprises a plurality of inductors for arranging in connection with the output terminals.

Furthermore, each one of the devices may comprise a second connection element on the circuit board being connected to the first connection element via a conductor track in the circuit board. The second connection element may be arranged to be connected to an external device, preferably to a motor phase of an electric motor.

According to a second aspect, an electric converter system is provided. The electric converter system comprises a number of output terminals, such as three for three-phase applications, and an electric converter comprising a controller and at least a plurality of semiconductor switches configured to produce an alternating output voltage at the output terminals. Furthermore, the electric converter system preferably comprises an electromagnetic compatibility filter arrangement in accordance with the first aspect, having a respective number of electromagnetic compatibility filter devices relative to the number of output terminals, such as three. The electromagnetic compatibility filter devices are arranged in electrical connection with the output terminals, respectively, by the electrical connection arrangement, such as the Y-cable or the like.

In various embodiments, the output terminals may be arranged spaced apart with respect to each other, and the circuit boards of the devices may be arranged spaced apart on top of each other, such as forming a multilayer assembly.

Alternatively or in addition, the devices may be arranged on top of each other at least partly misaligned in a lateral direction relative to their center portions.

According to a third aspect, a method of manufacture of an electromagnetic compatibility filter arrangement for connecting to output terminals of an electric converter is provided. The method comprises producing or obtaining a plurality of electromagnetic compatibility filter devices, and producing or obtaining an electrical connection arrangement for connecting first connectors of said plurality of electromagnetic compatibility filter devices to each other. Each one of the devices comprises a circuit board, a first connection element in the circuit board for providing electrical connection, or to be connected, to an output terminal of the electric converter, the first connector in the circuit board for connecting to another of the plurality of electromagnetic compatibility filter devices, and at least one capacitor in the circuit board and being electrically connected between the first connection element and the first connector.

Furthermore, the electrical connection arrangement may comprise a plurality of third connectors to be removably connected to respective ones of the first connectors. In addition, the number of the third connectors may be at least three, and the third connectors are connected in series with each other, such as in a Y-cable having one common and a plurality of other ends.

In some embodiments, at least one of the devices may comprise a second connector being electrical separated at least from the first connection element, the first connector, and the at least one capacitor of the at least one electromagnetic compatibility filter device for providing a fixed position for a third connector of the electrical connection arrangement, when the third connector is not connected to the first connector, thus providing an idle position or "a parking space" for the third connector.

In various embodiments, the electromagnetic compatibility filter arrangement may be an LC filter arrangement, and comprises a plurality of inductors for arranging in connection with the output terminals.

Furthermore, in addition, each one of the devices may comprise a second connection element on the circuit board being connected to the first connection element via a conductor track in the circuit board, wherein the second connection element is arranged to be connected to an external device, preferably to a motor phase of an electric motor.

According to a further aspect, an electromagnetic compatibility filter arrangement for connecting to output terminals of an electric converter, such as of a frequency converter or an inverter, is provided. The electromagnetic compatibility filter arrangement comprises a plurality of electro-magnetic compatibility filter devices. Each one of the devices comprises a circuit board, a first connection element in the circuit board for providing electrical connection, or to be connected, to an output terminal of the electric converter, a first connector in the circuit board for connecting to another of the plurality of electromagnetic compatibility filter devices, at least one capacitor in the circuit board and being electrically connected between the first connection element and the first connector, and a second connector being electrical separated at least from the first connection element, the first connector, and the at least one capacitor of the at least one electromagnetic compatibility filter device. The electromagnetic compatibility filter arrangement also comprises an electrical connection arrangement for connecting the first connectors of said plurality of electromagnetic compatibility filter devices to each other, wherein the electrical connection arrangement comprises a plurality of third connectors adapted to be removably connected to respective ones of the first connectors, wherein the second connector of the plurality of electromagnetic compatibility filter devices is adapted to provide a fixed position, or an idle position, for the respective third connector of the electrical connection arrangement, when the third connector is not being connected to the first connector.

The present invention provides an electromagnetic compatibility filter arrangement for connecting to output terminals of an electric converter, an electric converter system, and a method of manufacture of an electromagnetic compatibility filter arrangement for connecting to output terminals of an electric converter. The present invention provides advantages over known solutions in that it provides a cost efficient and easy way to arrange an electromagnetic compatibility filter arrangement close to the output terminals of the electric converter, and makes it also very easy to disconnect the filter arrangement when needed. In case one of the devices malfunctions, only the broken one needs to be replaced, thus avoiding the replacement of the whole filter arrangement.

Various other advantages will become clear to a skilled person based on the following detailed description.

The expression "a number of" may herein refer to any positive integer starting from one, that is, being one, two, three, etc.

The expression "a plurality of" may refer to any positive integer starting from two, that is, being two, at least two, three, at least three, four, etc.

The terms "first", "second" and "third" are herein used to distinguish one element from other element, and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also unrecited features. The features recited in appended claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF THE DRAWINGS

Some embodiments of the invention are illustrated by way of example, and not by way of limitation, in the figures of the accompanying drawings.

FIGS. 3A and 3B illustrate schematically electromagnetic compatibility filter arrangements.

FIG. 5 shows a flow diagram of a method of manufacture of electromagnetic compatibility filter arrangement.

DETAILED DESCRIPTION

Figure 1A:
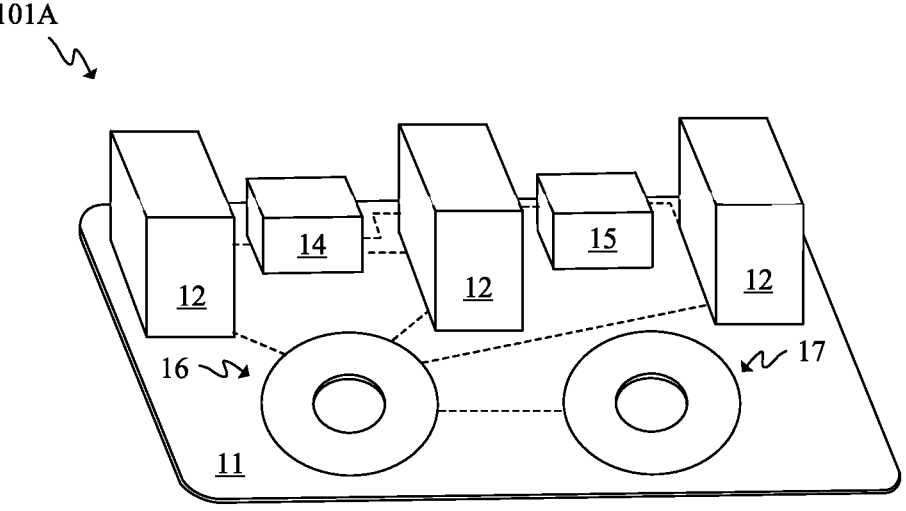
FIGS. 1A and 1B illustrate schematically an electromagnetic compatibility filter device.
Figure 1B:
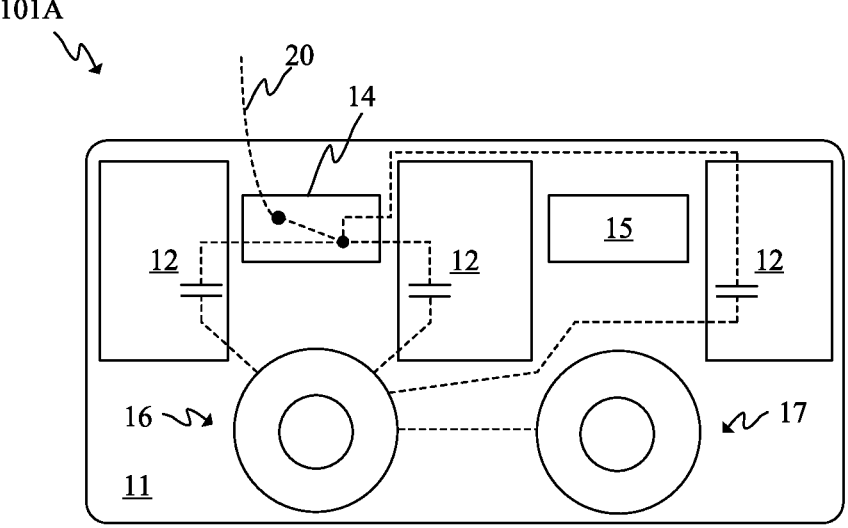

FIGS. 1A and 1B illustrate schematically an electromagnetic compatibility filter device 101A. As discussed hereinbefore, there are, preferably, a plurality of such devices, optionally identical, however, at least functionally similar, comprised in an electromagnetic compatibility filter arrangement. FIG. 1A illustrates the device 101A from a perspective and FIG. 1B from above.

In FIGS. 1A and 1B, the electromagnetic compatibility filter device 101A comprises a circuit board 11, and a first connection element 16 in the circuit board 11 for providing electrical connection to an output terminal, for example, of an electric converter. The device 101A further comprises a first connector 14 in the circuit board 11 for connecting to another of the plurality of electromagnetic compatibility filter devices, and at least one capacitor 12 in the circuit board 11 and being electrically connected between the first connection element 16 and the first connector 14. In the embodiment shown in FIGS. 1A and 1B, there are three parallel-connected capacitors 12, however, the number of capacitors 12 may vary depending on the embodiment. Some electrical connections, preferably via conductors or conductor tracks in the circuit board 11, are shown with dashed lines in FIGS. 1A and 1B.

FIG. 1B further schematically illustrates an electrical connection arrangement 20, which is external with respect to the device 101A, being connected to the first connector 14.

Figure 2:
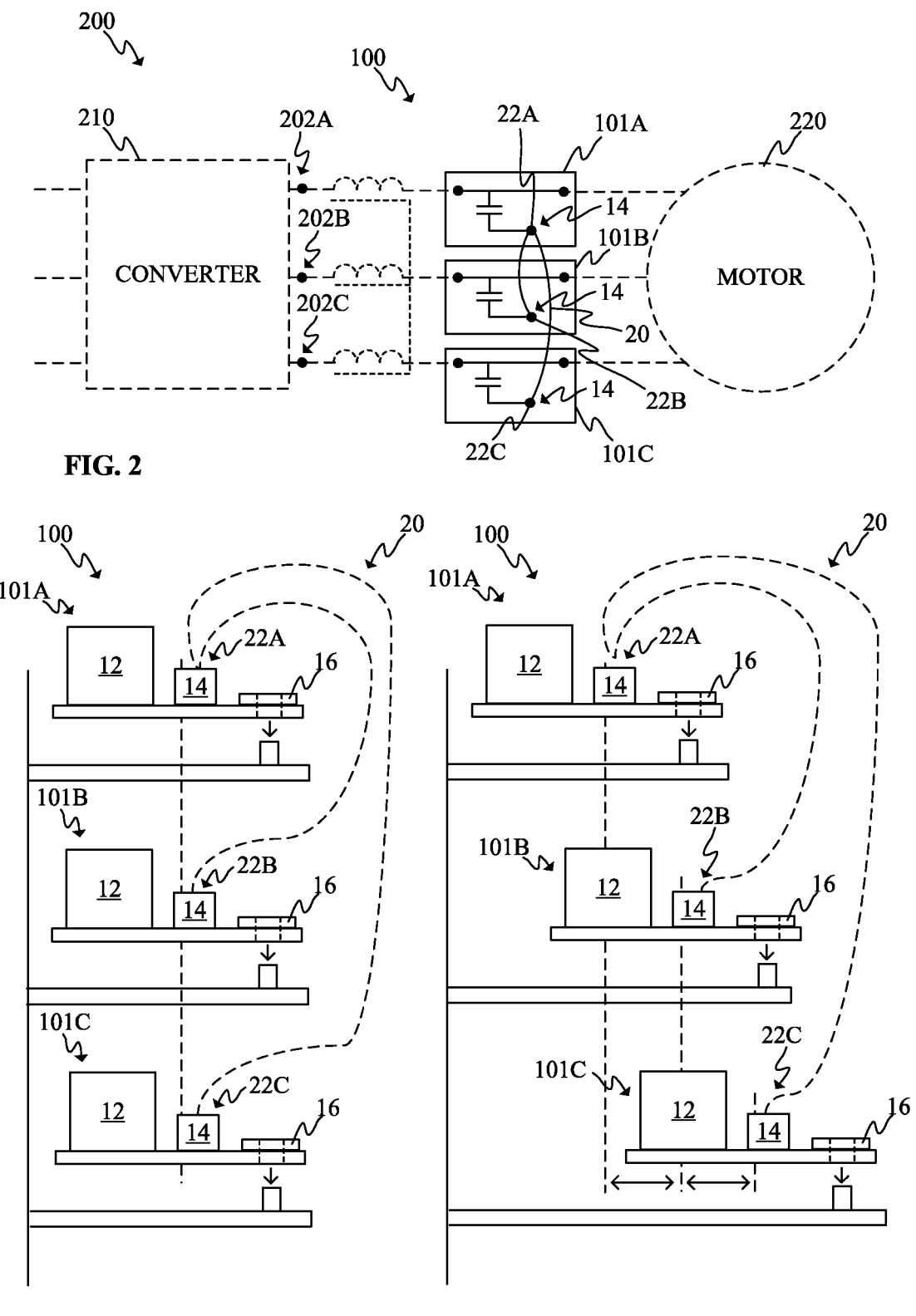
FIG. 2 illustrates schematically an electromagnetic compatibility filter arrangement and an electric converter system.

FIG. 2 illustrates schematically an electromagnetic compatibility filter arrangement 100 for connecting to output terminals 202A-202C of an electric converter 210, and an electric converter system 200. The electromagnetic compatibility filter arrangement 100 comprises a plurality of electromagnetic compatibility filter devices 101A-101C, in this case three as a three-phase converter is shown as an example.

Each one of the devices 101A-101C comprises at least a circuit board 11, a first connection element 16 in the circuit board 11 for providing electrical connection to an output terminal 202A-202C of the electric converter 210. Each one of the devices 101A-101C also comprises a first connector 14 in the circuit board 11 for connecting to another of the plurality of electro-magnetic compatibility filter devices 101A-101C. Furthermore, each one of the devices 101A-101C comprises at least one capacitor 12, or several as in FIGS. 1A and 1B, in the circuit board 11 and being electrically connected between the first connection element 16 and the first connector 14.

Furthermore, the electromagnetic compatibility filter arrangement 100 comprises an electrical connection arrangement 20, such as a cable or set of cables, for connecting the first connectors 14 of said plurality of electromagnetic compatibility filter devices 101A-101C to each other.

In various embodiments, the electrical connection arrangement 20 may comprise a plurality of third connectors 22A-22C adapted to be removably connected to respective ones of the first connectors 14. Thus, the third connectors 22A-22C can be easily connected and disconnected from the first connectors 14. There may be, for example, male and female connector portions for the third 22A-22C and first connectors 14, respectively, or vice versa. Furthermore, the number of the third connectors 22A-22C may be at least three, and the third connectors 22A-22C may be connected in series with each other, such as in a Y-cable having one common end or point of coupling, and a plurality of other ends.

In some embodiments, the electrical connection arrangement 20 has one common end or point of coupling (such as comprised in one of the third connectors 22A-22C), in FIG. 2 being 22A, and a plurality of other ends, in FIG. 2 being 22B and 22C, such as in a Y-cable. The electrical connection arrangement 20 may be adapted such that the other ends 22B, 22C are electrically connected via the common end or point of coupling 22A to each other only if the common end or point of coupling 22A is also connected to the respective first connector 14 (thus the other ends 22B, 22C may be connected to each other via the first connector 14). Therefore, detachment of the common end or point of coupling 22A from the respective first connector 14 causes simultaneously also electrical disconnection of the other ends 22B, 22C, even if they remain attached to their respective first connectors 14, because the electrical connection between the other ends 22B, 22C is being interrupted by the detachment of the common end or point of coupling 22A from its respective first connector 14. This provides an easy way to disconnect the electrical connection arrangement 20 from the output of the electric converter 210.

In some embodiments, at least one, or some or even each one, of the devices 101A-101C may comprise a second connector 15 being electrical separated at least from the first connection element 16, the first connector 14, and the at least one capacitor 12 of the respective at least one electromagnetic compatibility filter device 101A-101C for providing a fixed position for the third connector 22A-22C of the electrical connection arrangement 20, when the third connector 22A-22C is not connected to the first connector 14. This/these dummy connector(s) is/are arranged to serve as (an) idle or (a) "parking" position(s) for the disconnected third connector(s) 22A-22C, preferably only one of them (corresponding to the common end or point of coupling in some cases) to prevent free-hanging cables with risks for electrical short circuiting. The second connector(s) 15 are thus adapted to receive the third connector(s) 22A-22C and, therefore, the shape and structure of the second connector(s) 15 may be substantially identical, however, not necessarily, to the shape and structure of the first connector(s) 14, or specifically the connector housing thereof. As understood, the second connector 15, being "dummy", may not include electrical connections, but rather just the connector housing which is configured to receive the third connector(s) 22A-22C.

Furthermore, in some embodiments, the electromagnetic compatibility filter arrangement 100 may be an LC filter arrangement, and thus comprise a number, or a plurality, of inductors for arranging in connection with the output terminals 202A-202C. Such inductors are shown in FIG. 2 with dashed lines between the electric converter 210 and the devices 101A-101C. As can further be seen, the inductors may be coupled inductors.

In some embodiments, each one of the devices 101A-101C may comprise a second connection element 17 on the circuit board 11 being connected to the first connection element 16 via a conductor track in the circuit board 11, wherein the second connection element 17 is arranged to be connected to an external device, preferably to a motor phase of an electric motor 220.

Figure 4:
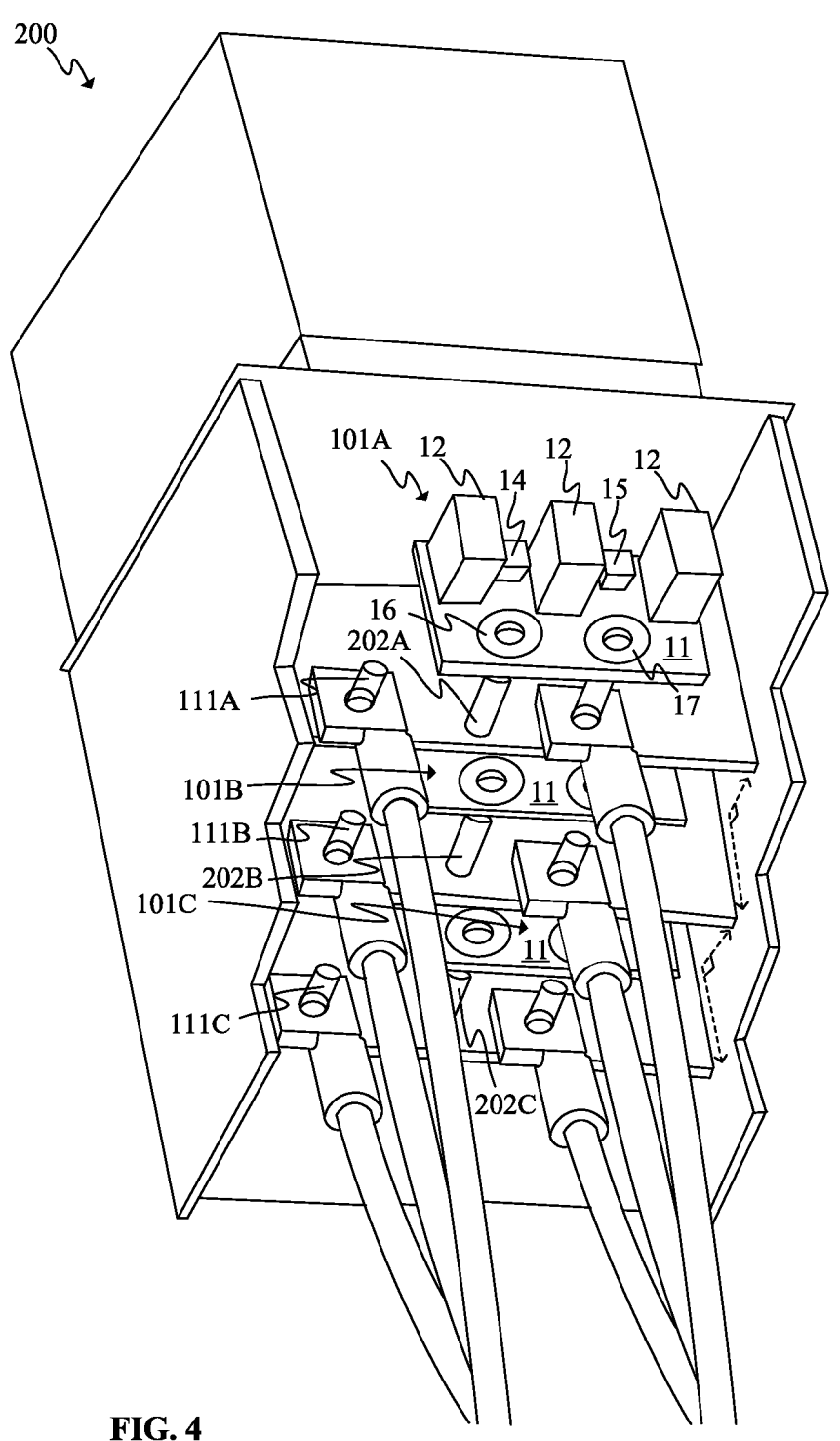
FIG. 4 illustrates schematically an electric converter system.

Therefore, also the converter system 200 in accordance with various embodiments, may be adapted to comprise, for example, at the output terminals 202A-202C thereof, pins or other such electrically conductive terminal portions for arranging to in connection with the second connection element 17 and the external device as will be shown in FIG. 4.

Furthermore, the electric converter system 200 may comprise, in addition to the number of out-put terminals 202A-202C and the electromagnetic compatibility filter arrangement 100 as described hereinabove, the electric converter 210 comprising a controller (not shown) and at least a plurality of semiconductor switches configured to produce an alternating output voltage at the output terminals 202A-202C.

FIGS. 3A and 3B illustrate schematically electromagnetic compatibility filter arrangements 100. As discussed hereinbefore, the electromagnetic compatibility filter arrangements 100 may be comprised in an electric converter system 200.

As shown in FIG. 3A, the electric converter system 200, for example, specifically the electric converter 210 thereof, comprises the output terminals 202A-202C being arranged spaced apart with respect to each other. Thus, the circuit boards 11 of the devices 101A-101C are also arranged spaced apart on top of each other, such as forming a multilayer assembly. As can be seen in FIG. 3A, the devices 101A-101C are arranged on top of each other in aligned manner. This is illustrated by the vertical dashed line in the figure. Such an assembly results in a com-pact structure in which the electrical connection arrangement 20 can be conveniently arranged to extend between the first connectors 14 of the devices 101A-101C.

FIG. 3B illustrates another embodiment of the electromagnetic compatibility filter arrangement 100. In case, the devices 101A-101C are arranged on top of each other at least partly misaligned in a lateral direction relative to their center portions. This is illustrated by the vertical dashed lines in the figure. As can clearly be seen, the lower ends of the vertical lines are spaced apart. The spacing may be, for example, at least two or even five centimeters.

FIG. 4 illustrates schematically an electric converter system 200. The converter system 200 is shown from a perspective view. As can be seen, the electric converter system 200 comprises a number of output terminals 202A-202C of the converter 210. As shown, the electric converter system 200 may indeed also comprise input terminals 111A-111C. The electric converter 210 comprises a controller (not shown) and at least a plurality of semiconductor switches configured to produce an alternating output voltage at the output terminals 202A-202C. Alternating or direct voltage/current may be supplied to the input terminals 111A-111C.

As can be seen in FIG. 4, the converter system 200 also comprises the electromagnetic compatibility filter arrangement 100 having a respective number of electromagnetic compatibility filter devices 101A-101C relative to the number of output terminals 202A-202C. The electromagnetic compatibility filter devices 101A-101C are arranged in electrical connection with the output terminals 202A-202C, respectively, by the electrical connection arrangement 20 which is not shown in FIG. 4. for the sake of legibility. Furthermore, reference signs are only added to the topmost device 101A, however, it is to be understood that the other two devices 101B, 101C are also included in the figure and their circuit boards 11 are clearly visible.

In FIG. 4, the devices 101A-101C are arranged on top of each other at least partly misaligned in a lateral direction relative to their center portions, similarly to FIG. 3B.

FIG. 5 shows a flow diagram of a method of manufacture of electromagnetic compatibility filter arrangement.

Item or method step 500 refers to a start-up phase of the method. Suitable, or at least necessary, equipment and components are obtained, and systems assembled.

Item or method step 510 refers to producing or obtaining a plurality of electromagnetic compatibility filter devices 101A-101C, preferably, in accordance with an embodiment described hereinbefore.

Item or method step 520 refers producing or obtaining an electrical connection arrangement 20, such as a cable, or specifically Y-cable having one common end or point of coupling, and a plurality of other ends, or a set of cables, for connecting, preferably removably, the first connectors 14 of said plurality of electromagnetic compatibility filter devices 101A-101C to each other. Method execution is stopped at step 599.

The specific examples provided in the description above are not exhaustive unless otherwise explicitly stated, nor should they be construed as limiting the scope and/or the applicability of the accompanied claims. The features recited in the accompanied dependent claims are mutually freely combinable unless otherwise explicitly stated. The verbs "to comprise" and "to include" are used in this document as open limitations that neither exclude nor require the existence of also unrecited features. Furthermore, it is to be understood that the use of "a" or "an", i.e. a singular form, throughout this document does not exclude a plurality.

What is claimed is:

1. An electromagnetic compatibility filter arrangement for connecting to output terminals of an electric converter, such as of a frequency converter or an inverter, the electromagnetic compatibility filter arrangement comprising:
   a plurality of electromagnetic compatibility filter devices, each one of the devices comprising:
   a circuit board,
   a first connection element in the circuit board for providing electrical connection to an output terminal of the electric converter,
   a first connector for connecting to another of the plurality of electromagnetic compatibility filter devices, and
   at least one capacitor arranged in the circuit board and being electrically connected between the first connection element and the first connector; and
   an electrical connection arrangement for connecting the first connectors of said plurality of electromagnetic compatibility filter devices to each other.

2. The electromagnetic compatibility filter arrangement of claim 1, wherein the electrical connection arrangement comprises a plurality of third connectors adapted to be removably connected to respective ones of the first connectors.

3. The electromagnetic compatibility filter arrangement of claim 2, wherein the number of the third connectors is at least three, and the third connectors are connected in series with each other, such as in a Y-cable having one common end or point of coupling, and a plurality of other ends.

4. The electromagnetic compatibility filter arrangement of claim 1, wherein at least one of the devices comprises a second connector being electrical separated at least from the first connection element, the first connector, and the at least one capacitor of the at least one electromagnetic compatibility filter device for providing a fixed position for a third connector of the electrical connection arrangement, when the third connector is not connected to the first connector.

5. The electromagnetic compatibility filter arrangement of claim 1, being an LC filter arrangement, and comprising a plurality of inductors for arranging in connection with the output terminals.

6. The electromagnetic compatibility filter arrangement of claim 1, wherein each one of the devices comprises a second connection element on the circuit board being connected to the first connection element via a conductor track in the circuit board, wherein the second connection element is arranged to be connected to an external device, preferably to a motor phase of an electric motor.

7. An electric converter system comprising:
a number of output terminals,
an electric converter comprising a controller and at least
a plurality of semiconductor switches configured to produce an alternating output voltage at the output terminals, and
the electromagnetic compatibility filter arrangement of claim 1 having a respective number of electromagnetic compatibility filter devices relative to the number of output terminals, wherein the electromagnetic compatibility filter devices are arranged in electrical connection with the output terminals, respectively, by the electrical connection arrangement.

8. The electric converter system of claim 7, wherein the output terminals are arranged spaced apart with respect to each other and the circuit boards of the devices are arranged spaced apart on top of each other, such as forming a multi-layer assembly.

9. The electric converter system of claim 7, wherein the devices are arranged on top of each other at least partly misaligned in a lateral direction relative to their center portions.

10. A method of manufacture of an electromagnetic compatibility filter arrangement for connecting to output terminals of an electric converter, the method comprising:
producing or obtaining a plurality of electromagnetic compatibility filter devices, each one of the devices comprising:
a circuit board,
a first connection element in the circuit board for providing electrical connection to an output terminal of the electric converter,
a first connector in the circuit board for connecting to another of the plurality of electromagnetic compatibility filter devices, and
at least one capacitor in the circuit board and being electrically connected between the first connection element and the first connector; and
producing or obtaining an electrical connection arrangement for connecting the first connectors of said plurality of electromagnetic compatibility filter devices to each other.

11. The method of claim 10, wherein the electrical connection arrangement comprises a plurality of third connectors to be removably connected to respective ones of the first connectors.

12. The method of claim 11, wherein the number of the third connectors is at least three, and the third connectors are connected in series with each other, such as in a Y-cable having one common and a plurality of other ends.

13. The method of claim 10, wherein at least one of the devices comprises a second connector being electrical separated at least from the first connection element, the first connector, and the at least one capacitor of the at least one electromagnetic compatibility filter device for providing a fixed position for a third connector of the electrical connection arrangement, when the third connector is not connected to the first connector.

14. The method of claim 10, wherein the electromagnetic compatibility filter arrangement is an LC filter arrangement, and comprises a plurality of inductors for arranging in connection with the output terminals.

15. The method of claim 10, wherein each one of the devices comprises a second connection element on the circuit board being connected to the first connection element via a conductor track in the circuit board, wherein the second connection element is arranged to be connected to an external device, preferably to a motor phase of an electric motor.

16. An electromagnetic compatibility filter arrangement for connecting to output terminals of an electric converter, such as of a frequency converter or an inverter, the electromagnetic compatibility filter arrangement comprising:
a plurality of electromagnetic compatibility filter devices, each one of the devices comprising:
a circuit board,
a first connection element in the circuit board for providing electrical connection to an output terminal of the electric converter,
a first connector in the circuit board for connecting to another of the plurality of electromagnetic compatibility filter devices, and
at least one capacitor in the circuit board and being electrically connected between the first connection element and the first connector,
a second connector being electrical separated at least from the first connection element, the first connector, and the at least one capacitor of the at least one electromagnetic compatibility filter device; and
an electrical connection arrangement for connecting the first connectors of said plurality of electromagnetic compatibility filter devices to each other, wherein the electrical connection arrangement comprises a plurality of third connectors adapted to be removably connected to respective ones of the first connectors, and
wherein the second connector of the plurality of electromagnetic compatibility filter devices is adapted to provide a fixed position for the respective third connector of the electrical connection arrangement, when the third connector is not connected to the first connector.

* * * * *